(12) United States Patent
Kajigaya

(10) Patent No.: US 9,177,619 B2
(45) Date of Patent: Nov. 3, 2015

(54) SEMICONDUCTOR DEVICE HAVING HIERARCHICAL BIT LINE STRUCTURE

(71) Applicant: PS4 LUXCO S.A.R.L., Luxembourg (LU)

(72) Inventor: Kazuhiko Kajigaya, Chuo-ku (JP)

(73) Assignee: PS4 Luxco S.a.r.l., Luxembourg (LU)

( * ) Notice: Subject to any disclaimer, the term of this patent is extended or adjusted under 35 U.S.C. 154(b) by 343 days.

(21) Appl. No.: 13/714,015

(22) Filed: Dec. 13, 2012

(65) Prior Publication Data

US 2013/0155798 A1   Jun. 20, 2013

(30) Foreign Application Priority Data

Dec. 20, 2011   (JP) ................................. 2011-278558

(51) Int. Cl.
  *G11C 7/02* (2006.01)
  *G11C 7/06* (2006.01)
  *G11C 11/4091* (2006.01)
  *G11C 11/4097* (2006.01)

(52) U.S. Cl.
  CPC ............ *G11C 7/065* (2013.01); *G11C 11/4091* (2013.01); *G11C 11/4097* (2013.01); *G11C 2207/005* (2013.01)

(58) Field of Classification Search
  USPC ....................................... 365/208, 230.03, 63
  See application file for complete search history.

(56) References Cited

U.S. PATENT DOCUMENTS

| | | | | |
|---|---|---|---|---|
| 6,009,024 A | * | 12/1999 | Hirata et al. | 365/190 |
| 6,256,221 B1 | * | 7/2001 | Holland et al. | 365/149 |
| 8,068,369 B2 | | 11/2011 | Kajigaya | |
| 8,248,834 B2 | | 8/2012 | Narui | |
| 2008/0175040 A1 | * | 7/2008 | Kushida et al. | 365/154 |

FOREIGN PATENT DOCUMENTS

| | | |
|---|---|---|
| JP | 2010-055729 A | 3/2010 |
| JP | 2011-034614 A | 2/2011 |

* cited by examiner

*Primary Examiner* — Vu Le

(57) ABSTRACT

A semiconductor device is disclosed which comprises first and second local bit lines coupled to a plurality of memory cells arranged in first and second areas, respectively, a differential type local sense amplifier amplifying a voltage difference between the first and second local bit lines, a global bit line arranged in an extending direction of the first and second local bit lines, and first and second switches controlling electrical connections between the first and second local bit lines and the global bit line, respectively.

17 Claims, 16 Drawing Sheets

SEMICONDUCTOR DEVICE HAVING HIERARCHICAL BIT LINE STRUCTURE

BACKGROUND OF THE INVENTION

1. Field of the Invention

The present invention relates to a semiconductor device comprising a memory cell array in which structures of bit lines and sense amplifiers are hierarchized.

2. Description of Related Art

In recent years, semiconductor devices such as DRAM have increased in capacity and decreased in size, and with this, memory cell arrays in which both structures of bit lines and sense amplifiers are hierarchized have been proposed. In such memory cell arrays, there are arranged local bit lines of a lower hierarchy and global bit lines of an upper hierarchy, and there are provided local sense amplifiers connected to the local bit lines and global sense amplifiers connected to the global bit lines. A configuration is known in which hierarchical bit lines of open bit line structure are used in a hierarchical memory cell array (for example, see Patent Reference 1). In this configuration, a differential type local sense amplifier needs to be connected to a pair of bit lines of the open bit line structure. Further, a configuration is known in which hierarchical bit lines of single-ended configuration are used in a hierarchical memory cell array (for example, see Patent Reference 2). In this configuration, a single-ended local sense amplifier needs to be connected to one single-ended bit line.

[Patent Reference 1] Japanese Patent Application Laid-open No. 2011-034614 (U.S. Pat. No. 8,248,834)

[Patent Reference 2] Japanese Patent Application Laid-open No. 2010-055729 (U.S. Pat. No. 8,068,369)

In the above hierarchical memory cell arrays, it is desirable to employ differential type sense amplifiers in order to obtain a sufficient sensing margin when amplifying a minute signal voltage read out from a memory cell. Meanwhile, in consideration of restriction of manufacturing process, the global bit lines formed in a wiring layer over the local bit lines are desired to have a single-ended configuration that is capable of widening a line pitch. However, a memory cell array in which the differential type local sense amplifier is connected to local bit lines of the open bit line structure and a single-ended global sense amplifier is connected to a global bit line of the single-ended configuration has not been proposed. In the memory cell array having such a configuration, a control method of hierarchical switches each of which controls an electrical connection between a pair of local bit lines of the open bit line structure and the single-ended global bit line has not been proposed. As descried above, in the conventional hierarchical memory cell arrays, it is difficult to achieve a configuration that has both advantages of using the differential type sense amplifier and the single-ended global bit line.

SUMMARY

A semiconductor device according to an embodiment of the disclosure comprises: a first local bit line coupled to a plurality of memory cells arranged in a first area; a second local bit line coupled to a plurality of memory cells arranged in a second area; a differential type local sense amplifier amplifying a voltage difference between the first and second local bit lines; a global bit line arranged in an extending direction of the first and second local bit lines; a first switch controlling an electrical connection between the first local bit line and the global bit line; and a second switch controlling an electrical connection between the second local bit line and the global bit line.

In another embodiment, such a semiconductor device is provided that includes: a first local bit line extending in a first direction; a second local bit line extending in the first direction; a plurality of first word lines each intersecting the first local bit line; a plurality of second word lines each intersecting the second local bit line; a plurality of first memory cells each coupled to the first bit line and an associate one of the first word lines; a plurality of second memory cells each coupled to the second bit line and an associate one of the second word lines; a sense amplifier arranged between the first and second local bit lines and including first and second nodes that are connected to the first and second local bit lines, respectively, the sense amplifier being configured to amplify a potential difference between the first and second nodes; a global bit line extending in the first direction along the first and second local bit lines; a first transistor circuit coupled to the first local bit line and the global bit line; and a second transistor circuit coupled to the second local bit line and the global bit line.

In still another embodiment, there is provided a semiconductor device that includes: a global bit line extending in a first direction; a global sense amplifier coupled to the global bit line to amplify a potential on the global bit line; a first local bit line extending in the first direction in substantially parallel to the global bit line, the first local bit line including first and second end portions and a first intermediate portion therebetween; a plurality of first memory cells each coupled to the first intermediate portion of the first local bit line; a second local bit line extending in the first direction in substantially parallel to the global bit line, the second local bit line including third and fourth end portions and a second intermediate portion therebetween; a plurality of second memory cells each coupled to the second intermediate portion of the second local bit line; a first local sense amplifier between the first end portion of the first local bit line and the third end portion of the second local bit line, the first local sense amplifier being configured to amplify a potential difference between the first and second local bit lines; a first transistor coupled between the first end portion of the first local bit line and the global bit line; a second transistor coupled between the second end portion of the first local bit line and the global bit line; a third transistor coupled between the third end portion of the second local bit line and the global bit line; and a fourth transistor coupled between the fourth end portion of the second local bit line and the global bit line;

DETAILED DESCRIPTION OF THE PREFERRED EMBODIMENTS

Embodiments of the present invention will be described in detail below with reference to accompanying drawings. In the following embodiments, the present invention will be applied to DRAM (Dynamic Random Access Memory) as an example of a semiconductor device. However, the present invention is not limited to the embodiments.

Figure 1:
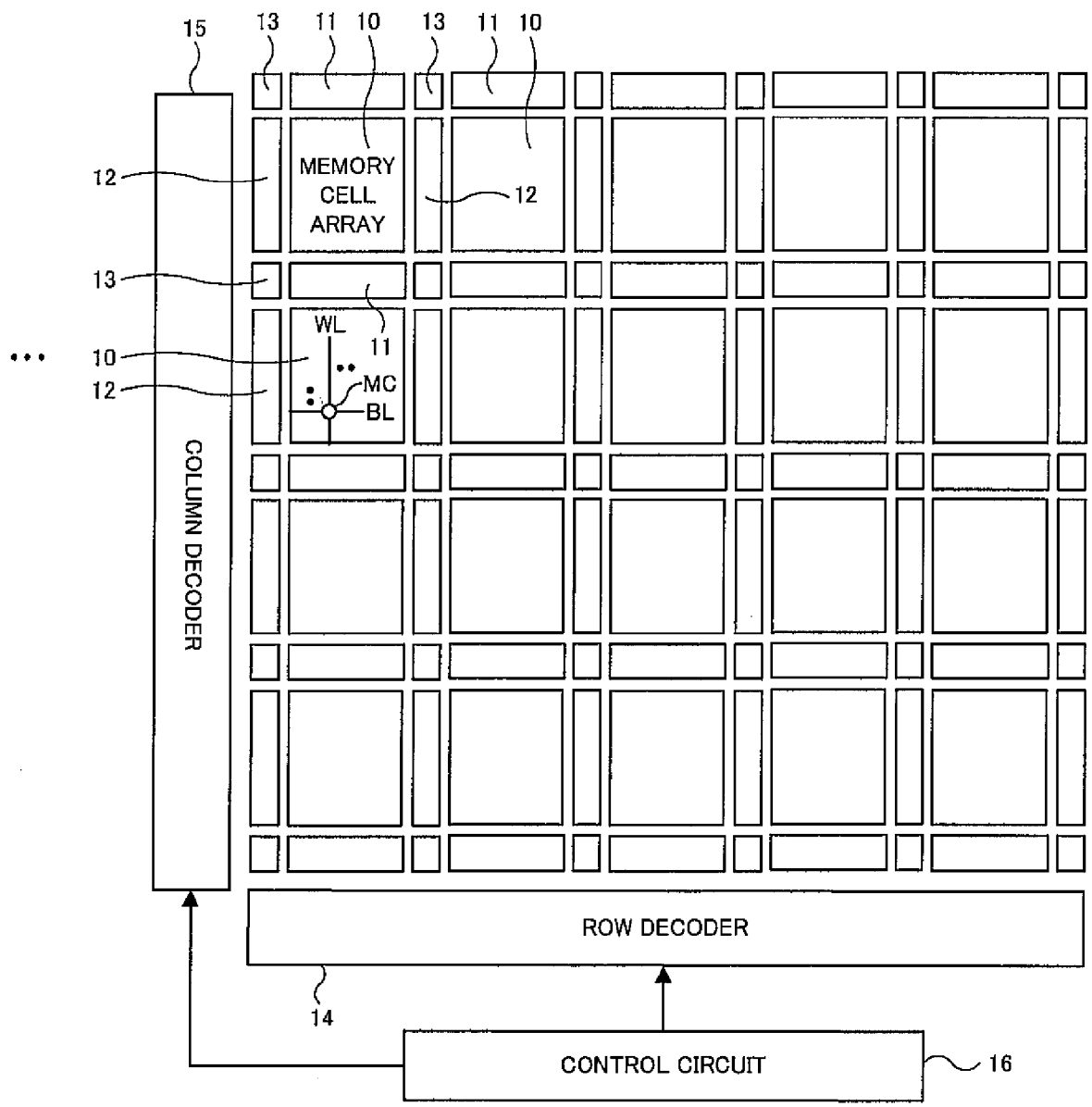
FIG. 1 is a block diagram showing an entire configuration of memory cell arrays and peripheral areas thereof in DRAM as a semiconductor device of an embodiment.

FIG. 1 is a block diagram showing an entire configuration of memory cell arrays and peripheral areas thereof in the DRAM as the semiconductor device of an embodiment. Here, the configuration of FIG. 1 of the embodiment is commonly employed in the later-described embodiments. As shown in FIG. 1, a plurality of memory cell arrays 10 are arranged in a matrix, and a plurality of sub-word drivers 11, a plurality of global sense amplifier arrays 12 and a plurality of global sense amplifier drive circuits 13 are respectively arranged around the memory cell arrays 10. Further, a row decoder 14 and a column decoder 15 are arranged near the memory cell arrays 10, and a control circuit 16 is arranged around them. The sub-word drivers 11 are arranged on both sides in a word line extending direction and the global sense amplifier arrays 12 are arranged on both sides in a bit line extending direction, with respect to each of the memory cell array 10. Each of the global sense amplifier drive circuits 13 is located in an area surrounded by the sub-word drivers 11 and the global sense amplifier arrays 12. The control circuit 16 entirely controls operations of the memory cell arrays 10, the row decoder 14 and the column decoder 15, and generates various required control signals, which are supplied to various parts.

In the above configuration, in each of the memory cell arrays 10, there are arranged a plurality of word lines WL, a plurality of hierarchical bit lines BL (later-described global bit lines GBL and local bit lines LBL) and a plurality of local sense amplifiers, and there are formed a plurality of memory cells MC at intersections of the plurality of word lines WL and a plurality of local bit lines LBL. The row decoder 14 selects a main word line (not shown) corresponding to a row address, and the column decoder 15 selects one bit line BL (global bit line GBL) corresponding to a column address. Each of the sub-word drivers 11 selects one sub-word line (word line WL) based on the above selected main word line and a lower row address. Each of the global sense amplifier arrays 12 includes a plurality of global sense amplifiers GSA (FIG. 2) aligned in the word line extending direction, which are connected to a plurality of global bit lines GBL. The local bit lines LBL, the global bit lines GBL, the global sense amplifiers and the local sense amplifiers will be described in detail later.

Figure 2:
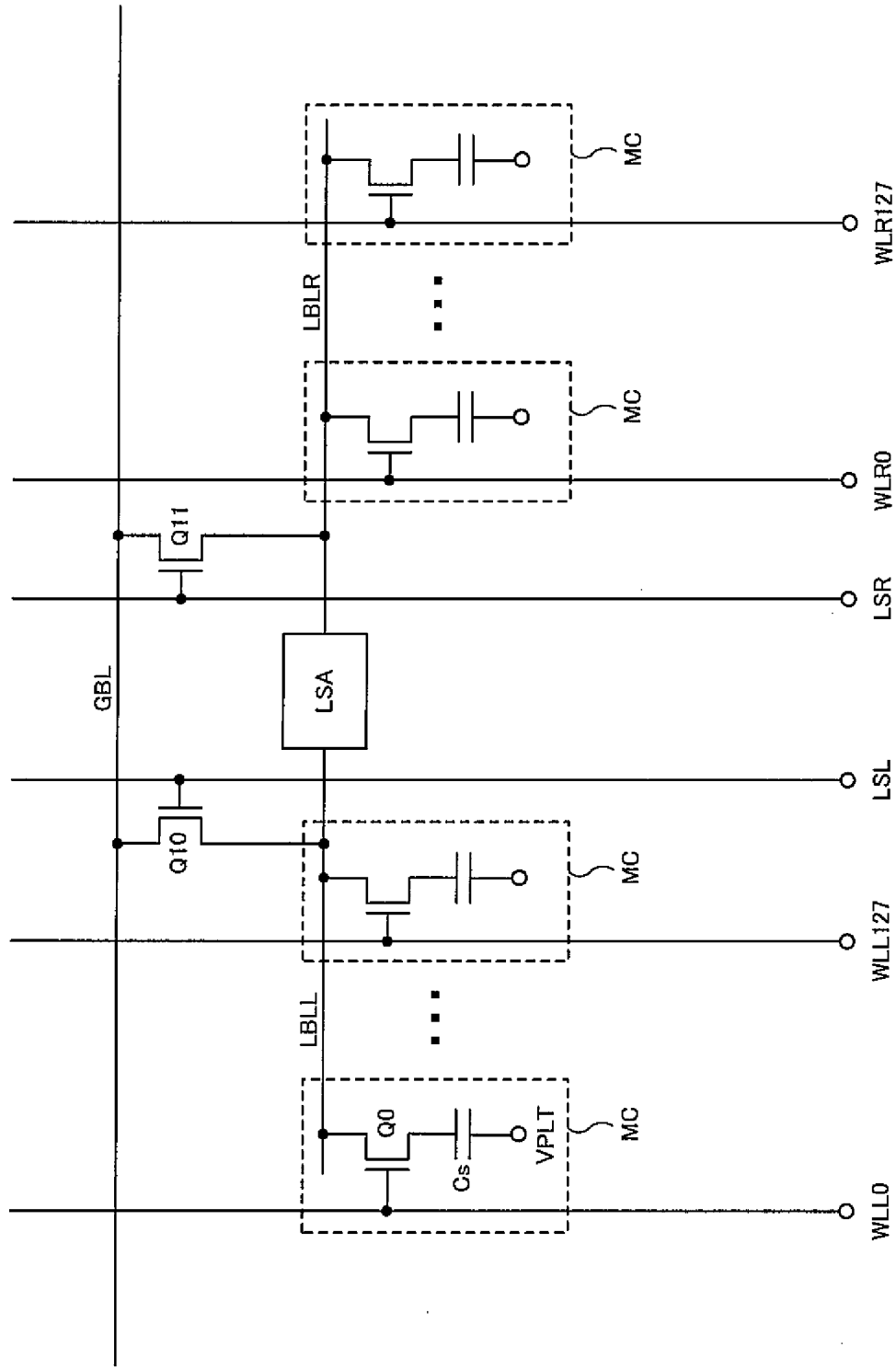
FIG. 2 is a diagram showing a circuit configuration of a main part of a memory cell array 10 of FIG. 1.

FIG. 2 shows a circuit configuration of a main part of the memory cell array 10 of FIG. 1. The circuit configuration of FIG. 2 includes one global bit line GBL, one local sense amplifier LSA, one pair of local bit lines LBL (a local bit line LBLL on the left side and a local bit line LBLR on the right side), a plurality of word lines WL (a plurality of word lines WLL on the left side and a plurality of word lines WLR on the right side), a plurality of memory cells MC, and two NMOS (N-channel Metal-Oxide-Semiconductor) type transistors Q10 and Q11. The two local bit lines LBLL and LBLR are arranged on the same straight line located on both sides of the local sense amplifier LSA, and respective one ends thereof are connected to the local sense amplifier LSA. As shown in FIG. 2, the local bit lines LBLL and LBLR have an open bit line structure, and the local sense amplifier LSA is a differential type sense amplifier. Here, the area shown in FIG. 2 can be partitioned into a left area (first area) and a right area (second area), which are configured symmetrically with respect to the local sense amplifier LSA at the center.

In the example of FIG. 2, 128 word lines WLL0 to WLL127 are arranged in the left area, and corresponding 128 memory cells MC are connected to the local bit line LBLL. Similarly, 128 word lines WLR0 to WLR127 are arranged in the right area, and corresponding 128 memory cells MC are connected to the local bit line LBLR. Hereinafter, in the following description, the word lines WLL0 to WLL127 and WLR0 to WLR127 may be referred to simply as "word lines WL" when they need not to be distinguished. Each of the memory cells MC is a 1T1C type memory cell composed of a selection transistor Q0 and a capacitor Cs. The selection transistor Q0 has a gate connected to the word line WL, a source connected to the local bit line LBLL or LBLR, and a drain connected to one electrode of the capacitor Cs. A common plate potential VPLT is supplied to the other electrode of the capacitor Cs.

The transistors Q10 and Q11 are a pair of transistor switches that selectively connects between the single-ended global bit line GBL and the pair of local bit lines LBL. That is, the transistor Q10 controls an electrical connection between the left local bit line LBLL and the global bit line GBL in response to a selection signal LSL applied to its gate, and the transistor Q11 controls an electrical connection between the right local bit line LBLR and the global bit line GBL in response to a selection signal LSR applied to its gate. In FIG. 2, when a memory cell MC in the left area is selected by either one of the word lines WLL0 to WLL127, the local bit line LBLL is connected to the global bit line GBL through the transistor Q10. Further, when a memory cell MC in the right area is selected by either one of the word lines WLR0 to WLR127, the local bit line LBLR is connected to the global bit line GBL through the transistor Q11.

Figure 3:
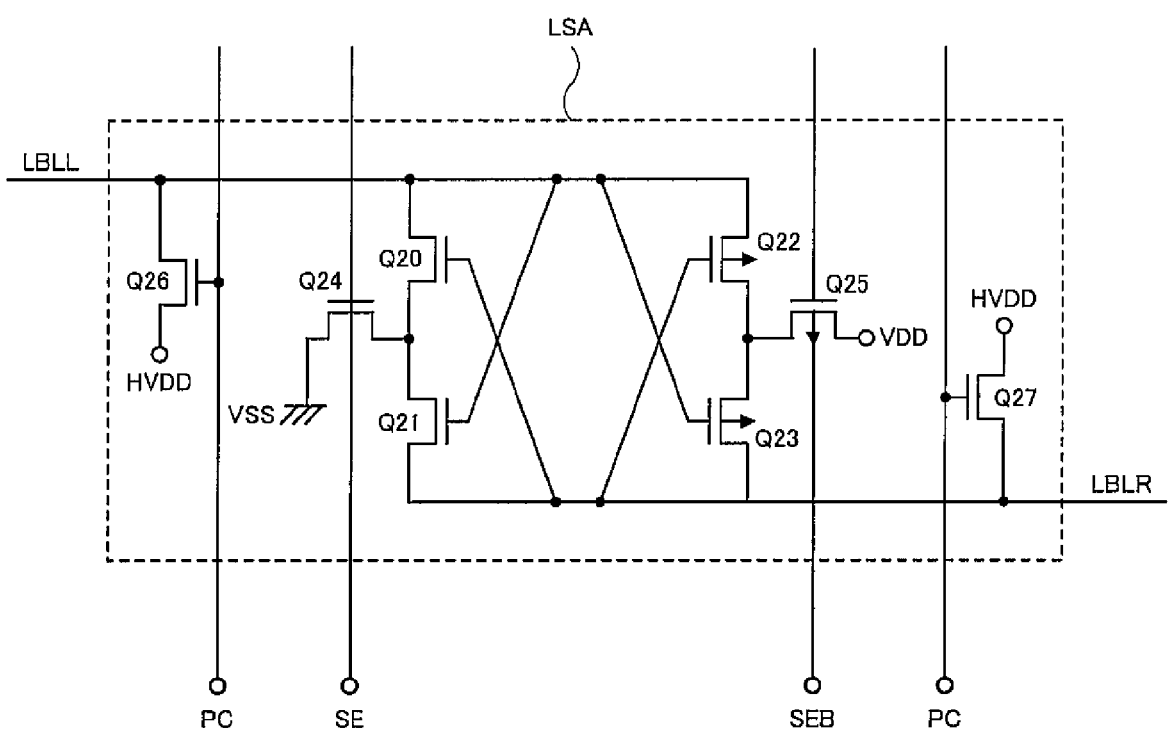
FIG. 3 is a diagram showing an example of a circuit configuration of a local sense amplifier LSA of FIG. 2.

FIG. 3 shows an example of a circuit configuration of the local sense amplifier LSA of FIG. 2. As shown in FIG. 3, the differential type local sense amplifier LSA includes NMOS type transistors Q20, Q21, Q24, Q26 and Q27 and PMOS (P-channel Metal-Oxide-Semiconductor) type transistors Q22, Q23 and Q25. Among these, the transistors Q20 to Q25 form a dynamic latch that amplifies and latches a voltage difference between a pair of local bit lines LBLL and LBLR. A ground potential VSS and a power supply voltage VDD are supplied to this dynamic latch through the transistor Q24 and Q25. The transistor Q24 and Q25 are switched in response to sense amplifier driving signals SE and SEB applied to respective gates thereof.

A pair of transistors Q26 and Q27 functions as a precharge circuit that precharges the pair of local bit lines LBLL and LBLR in response to a precharge signal PC applied to respective gates thereof. That is, when the precharge signal PC is set to High during a precharge period, both the local bit lines LBLL and LBLR are precharged to a precharge voltage HVDD. The precharge voltage HVDD is set to, for example, an intermediate potential between the power supply voltage VDD and the ground potential VSS.

Figure 4:
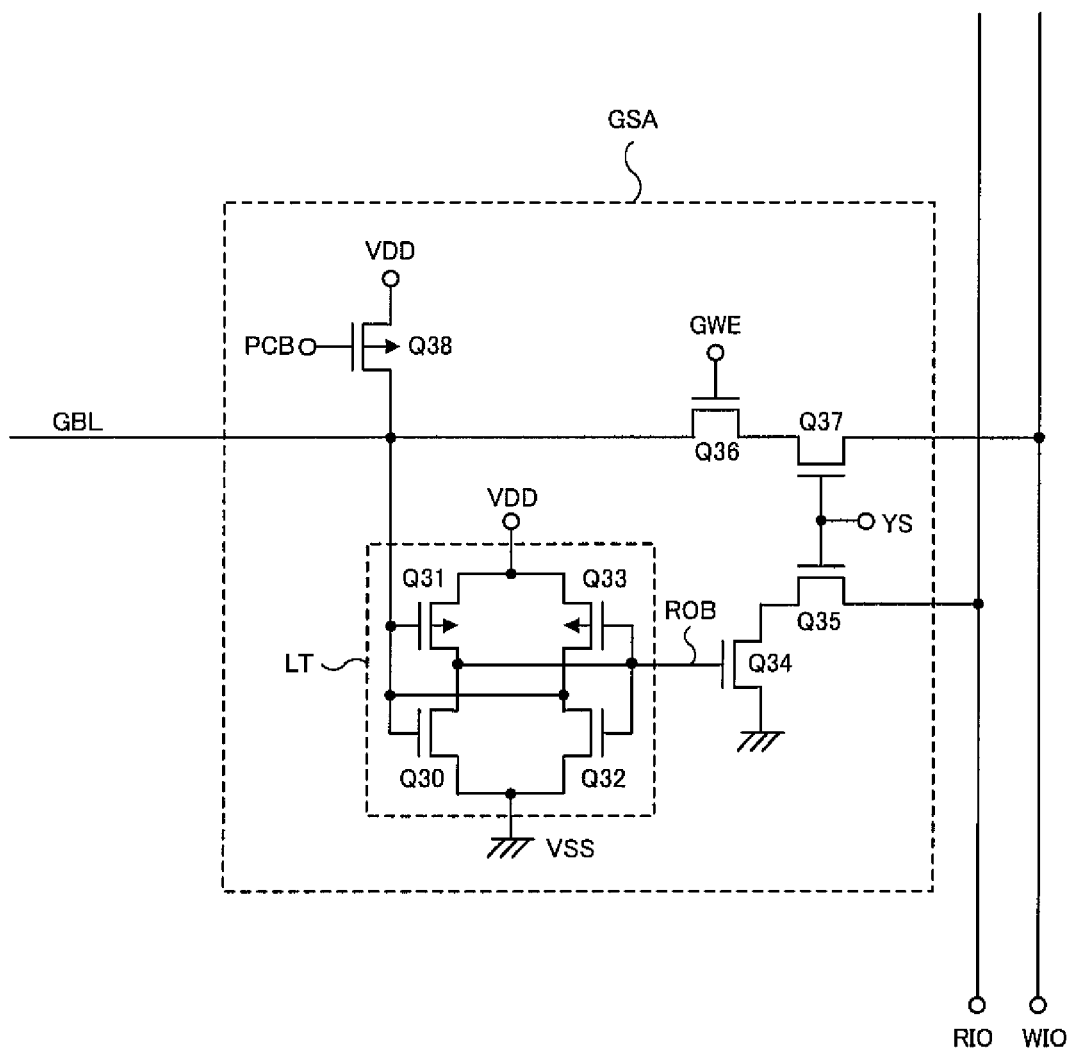
FIG. 4 is a diagram showing an example of a circuit configuration of a global sense amplifier GSA connected to one end of a global bit line GBL of FIG. 2.

FIG. 4 shows an example of a circuit configuration of a global sense amplifier GSA connected to one end of the global bit line GBL of FIG. 2. As shown in FIG. 4, the single-ended global sense amplifier GSA includes NMOS type transistors Q30, Q32, Q34, Q35, Q36 and Q37 and PMOS type transistors Q31, Q33 and Q38. Among these, the transistors Q30 to Q33 form a latch LT in which the global bit line GBL is connected to respective gates of a pair of input-side transistors Q30 and 31. Further, the global sense amplifier GSA is connected to a read I/O line RIO and a write I/O line WIO, respectively, through the transistors Q34, Q35, Q36 and Q37.

In a read operation through the global sense amplifier GSA, a selection signal YS applied to a gate of the transistor Q35 is set to High, and an output signal ROB from the above latch LT is transmitted as read data on the read I/O line RIO through the transistor Q34 and Q35. On the other hand, in a write operation through the global sense amplifier GSA, a write control signal GWE applied to a gate of the transistor Q36 and the above selection signal YS are both set to High, write data from the write I/O line WIO is transmitted to the global bit line GBL through the transistors Q37 and Q36, and thereafter the write data is written into a selected memory cell MC through the local bit line LBLL or LBLR while being stored in the latch LT at the same time.

Here, focusing attention on a path of the write data in the above write operation, when the write data is transmitted to the local bit line LBLL or LBLR to which the selected memory cell MC is connected (hereinafter, referred to as "selected local bit line LBL (S)"), the write data is directly written into the memory cell MC through the transistor Q10 or Q11 that is located at the same side as the selected local bit line LBL(S) without passing through the local sense amplifier LSA. In tandem with this, the data that has been read and latched in the local sense amplifier LSA is inverted. This is because one of the two transistors Q10 and Q11 on both sides of the local sense amplifier LSA can be selectively utilized as a switch transistor in the path of the write data. In comparison with a configuration in which only one switch transistor can be utilized as the switch transistor, a path for driving the write data after inverting it by the local sense amplifier LSA is not required, thereby obtaining an effect of speeding up the write operation.

Figure 5:
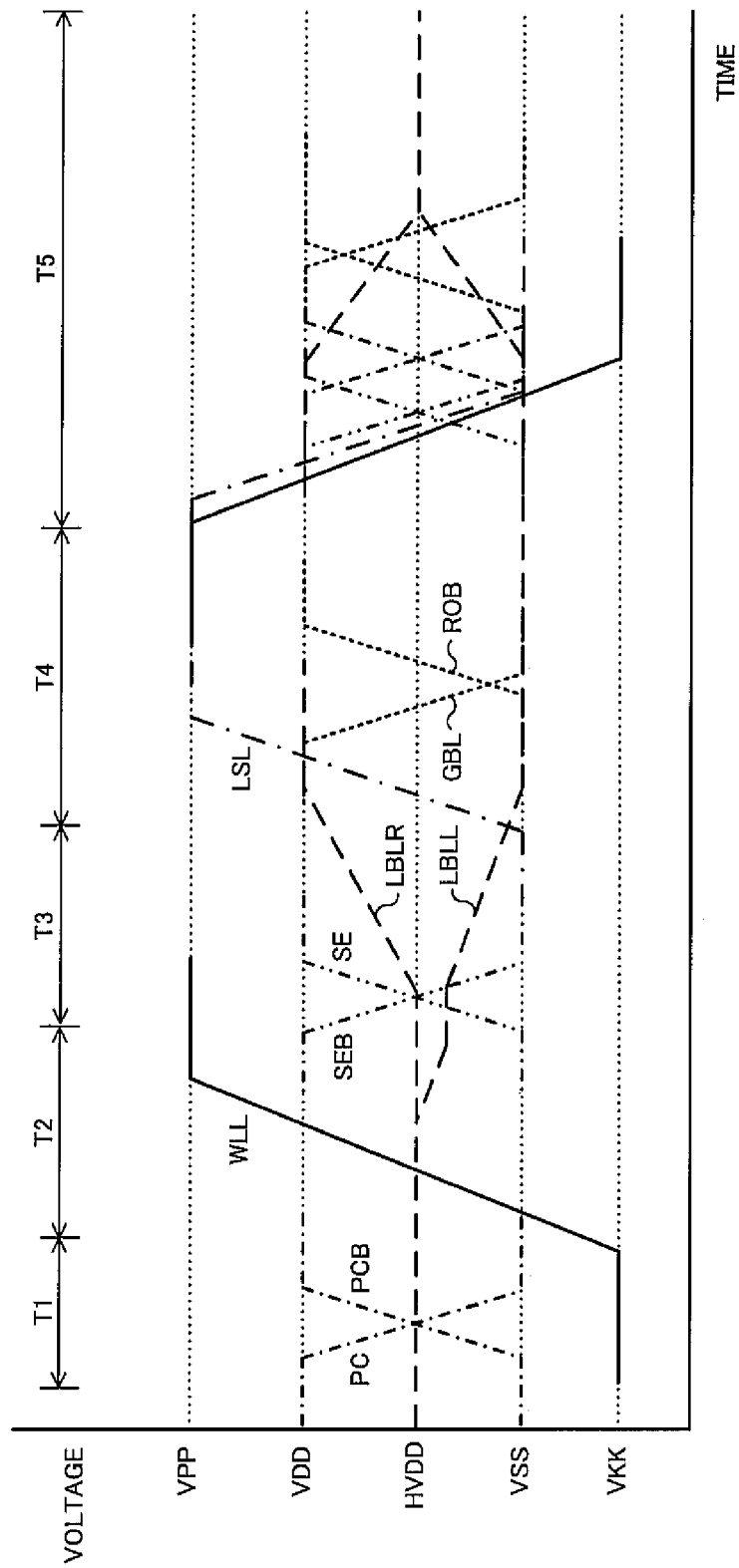
FIG. 5 is a diagram showing operation waveforms when reading low-level data from a memory cell MC regarding a read operation in DRAM of the embodiment.
Figure 6:
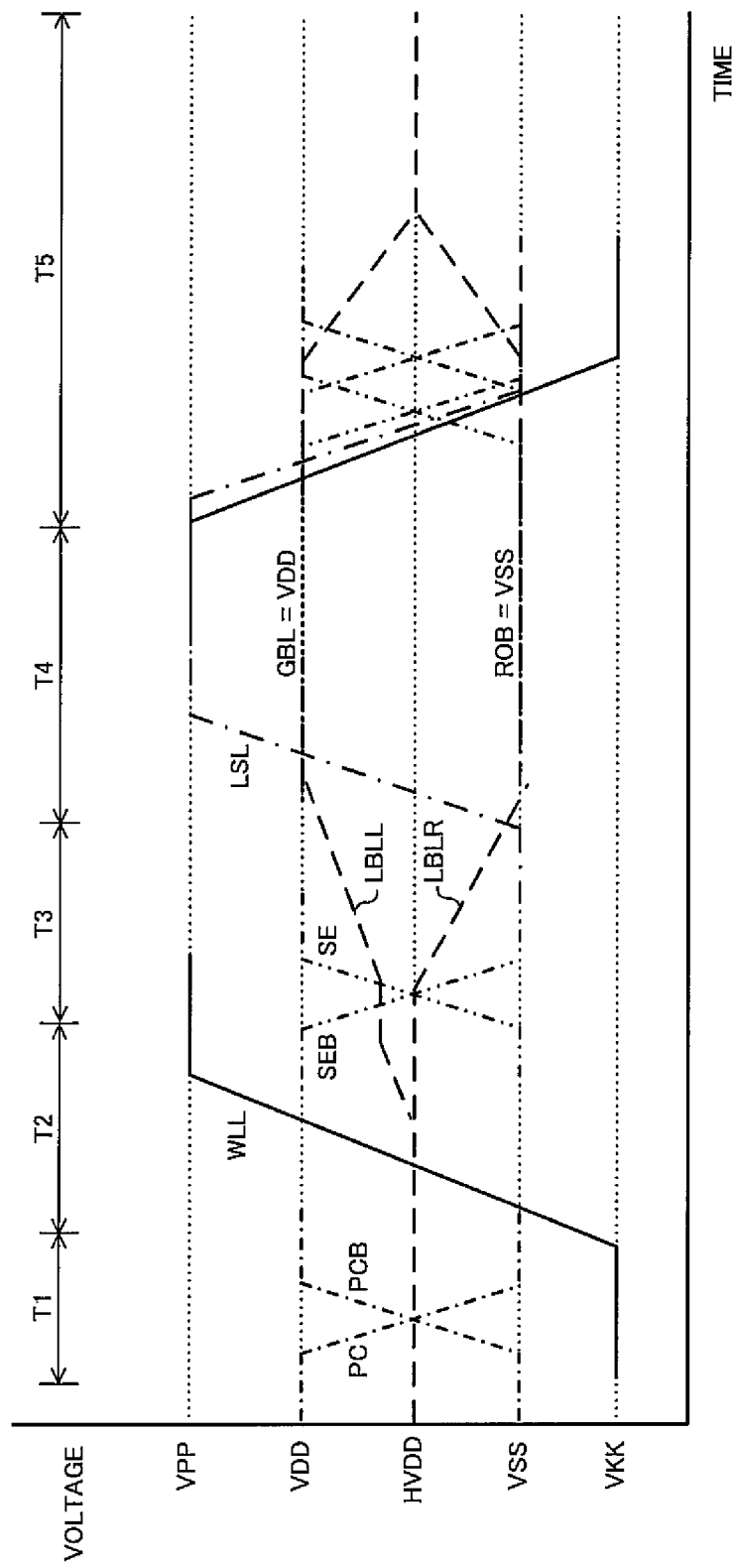
FIG. 6 is a diagram showing operation waveforms when reading high-level data from the memory cell MC regarding the read operation in DRAM of the embodiment.

Next, a read operation in DRAM of the embodiment will be described with reference to FIGS. 5 and 6. FIG. 5 shows operation waveforms when reading low-level data from the memory cell MC, and FIG. 6 shows operation waveforms when reading high-level data from the memory cell MC. In the operations of FIGS. 5 and 6, an arbitrary one of the word lines WLL0 to WLL127 (hereinafter, referred to simply as "word line WLL") in the left area of FIG. 2 is assumed to be selected. Thus, when an arbitrary one of the word lines WLR0 to WLR127 in the right area of FIG. 2 is selected, a bilaterally symmetric operation of FIG. 2 may be assumed in the following description. As shown in upper sides of FIGS. 5 and 6, each entire operation is segmented into five periods (T1 to T5). Besides, in relation to voltage levels indicated along a vertical axis, the power supply voltage VDD and the ground potential VSS may be referred to simply as "High" and "Low", respectively.

As shown in FIG. 5, in the read operation of the low-level data, a series of precharge operations are performed during a precharge period T5 (last period shown in FIG. 5) prior to a precharge halt period T1. That is, the local bit line LBL has been precharged to the precharge voltage HVDD by the precharge signal PC set to High and the global bit line GBL has been precharged to the power supply voltage VDD by the precharge signal PCB set to Low. Thereafter, when moving into the precharge halt period T1, the precharge signals PC and PCB are inverted respectively, and the local bit line LBL becomes floating in a state of being set to the precharge voltage HVDD, and the global bit line GBL is maintained at the power supply voltage VDD by the latch LT (FIG. 4). Subsequently, when moving into a cell selection period T2, the word line WLL is driven to a voltage VPP (VPP>VDD), and a signal of "Low" is read out from the selected memory cell MC so that the potential of the local bit line LBLL drops to a predetermined level.

Next, when moving into a first amplification period T3, a pair of sense amplifier driving signals SE and SEB is inverted, and the dynamic latch (FIG. 3) in the local sense amplifier LSA is driven. As a result, the voltage difference of the pair of local bit lines LBLL and LBLR is amplified and latched by the dynamic latch, and a potential of one local bit line LBLL drops to the ground potential VSS, while a potential of the other local bit line LBLR rises to the power supply voltage VDD. Subsequently, when moving into a second amplification period T4, the selection signal LSL is set to the voltage VPP so that the transistor Q10 turns on, and the potential of the global bit line GBL drops to the ground potential VSS that is the same as for the local bit line LBLL. As a result, the latch LT in the global sense amplifier GSA is inverted so that the output signal ROB thereof rises to the power supply voltage VDD.

Thereafter, when the selection signal YS is set to High, the operation described with FIG. 4 is performed in the corresponding global sense amplifier GSA, and operation waveforms thereof are omitted in FIG. 5. Then, when moving into the precharge period T5, the word line WLL is driven to a voltage VKK (VKK<VSS), and the memory cell MC is disconnected from the local bit line LBLL. In tandem with this, the selection signal LSL is set to the ground potential VSS so that the transistor Q10 turns off, and subsequently the pair of sense amplifier driving signals SE and SEB are inverted again so that the dynamic latch in the local sense amplifier LSA goes into a standby state. Further, the precharge signals PC and PCB are inverted respectively, and the local bit lines LBLL and LBLR are precharged to the precharge voltage HVDD while the global bit line GBL is precharged to the power supply voltage VDD. At this point, the output signal ROB of the latch LT in the global sense amplifier GSA drops to the ground potential VSS.

Next, as shown in FIG. 6, in the read operation of the high-level data, operation waveforms before and during the precharge halt period T1 are the same as those in FIG. 5, so description thereof will be omitted. Meanwhile, when moving into the cell selection period T2, the word line WLL is driven to the voltage VPP, and a signal of "High" is read out from the selected memory cell MC so that the potential of the local bit line LBLL rises to a predetermined level.

Subsequently, when moving into the first amplification period T3, the pair of sense amplifier driving signals SE and SEB are inverted so that the dynamic latch in the local sense amplifier LSA is driven. As a result, the voltage difference between the pair of local bit lines LBLL and LBLR is amplified and latched by the dynamic latch, and the potential of one local bit line LBLL rises to the power supply voltage VDD, while the potential of the other local bit line LBLR drops to the ground potential VSS. Subsequently, when moving into the second amplification period T4, the selection signal LSL is set to the voltage VPP so that the transistor Q10 turns on. At this point, since the global bit line GBL and the local bit line LBLL are at the same potential (power supply voltage VDD), the latch LT in the global sense amplifier GSA latches the power supply voltage VDD and the output signal ROB thereof continues to be maintained at the ground potential VSS. Subsequent operations are the same as those of FIG. 5, so description thereof will be omitted.

Figure 7:
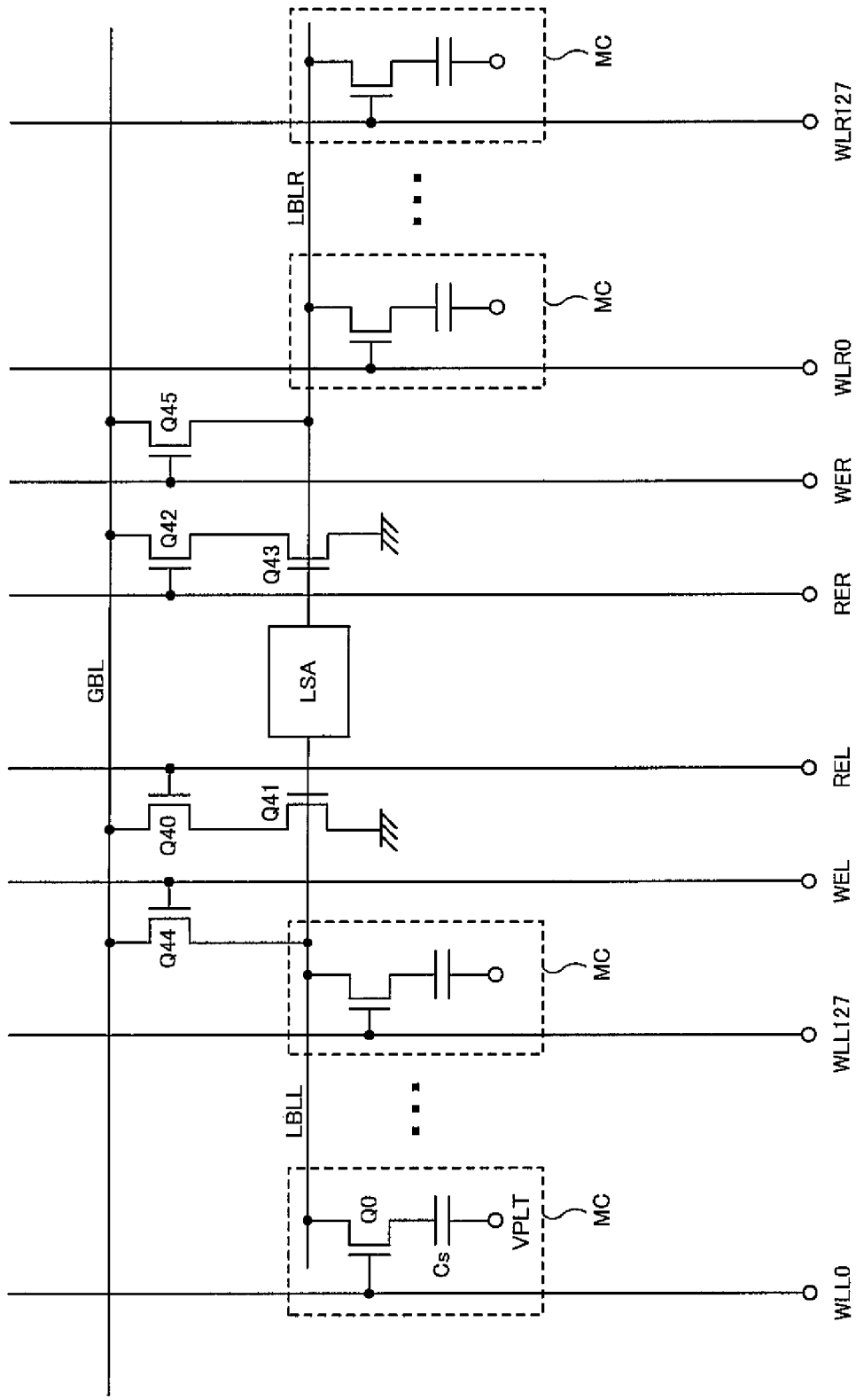
FIG. 7 is a diagram showing a circuit configuration of a main part of the memory cell array 10 of an embodiment.

Next, a semiconductor device of an embodiment will be described with reference to FIGS. 7 to 9. The entire configuration of FIG. 1 is common in DRAM as the semiconductor device of this embodiment. FIG. 7 shows a circuit configuration of a main part of the memory cell array 10 of this embodiment. In the circuit configuration shown in FIG. 7, the global bit line GBL, the local sense amplifier LSA, the local bit lines LBLL and LBLR, the plurality of word lines WL and the plurality of memory cells MC are the same as those in the circuit configuration of FIG. 2. Also, respective circuit configurations of the local sense amplifier LSA and the global sense amplifier GSA in FIG. 7 are the same as those in FIGS. 3 and 4. In the following, in relation to the circuit configuration of FIG. 7, points different from the circuit configuration of FIG. 2 will be mainly described.

The circuit configuration of FIG. 7 includes six NMOS type, transistors Q40, Q41, Q42, Q43, Q44 and Q45. The transistors Q40 and Q41 are connected in series between the global bit line GBL and the ground potential VSS, a read control signal REL is applied to a gate of the transistor Q40, and a gate of the transistor Q41 is connected to the left local bit line LBLL. Similarly, the transistors Q42 and Q43 are connected in series between the global bit line GBL and the ground potential VSS, a read control signal RER is applied to a gate of the transistor Q42, and a gate of the transistor Q43 is connected to the right local bit line LBLR. Further, the transistor Q44 controls an electrical connection between the left local bit line LBLL and the global bit line GBL in response to a write control signal WEL applied to its gate, and the transistor Q45 controls an electrical connection between the right local bit line LBLR and the global bit line GBL in response to a write control signal WER applied to its gate.

In a read operation in FIG. 7, when a memory cell MC in the left area is selected by either one of the word lines WLL0 to WLL127, the read control signal RER is set to High for a certain period of time. As a result, data read out from the memory cell MC is transmitted along a path of the left local bit line LBLL, the local sense amplifier LSA, the right local bit line LBLR, the transistors Q43 and Q42, and the global bit line GBL. Similarly, when a memory cell MC in the right area is selected by either one of the word lines WLR0 to WLR127, the read control signal REL is set to High for a certain period of time. As a result, data read out from the memory cell MC is transmitted along a path of the right local bit line LBLR, the local sense amplifier LSA, the left local bit line LBLL, the transistors Q41 and Q40, and the global bit line GBL.

Accordingly, even if the memory cell MC in any of the left and right areas of FIG. 7 is to be read, read data would be inverted once by the local sense amplifier LSA in the path, and thereafter the read data would be inverted again when passing through the transistors Q43 and Q42 or the transistors Q41 and Q40. In other words, the read data of the memory cell MC is inverted twice so as to return to the original potential and is transmitted through the global bit line GBL, and thus the configuration of FIG. 7 operates in the same potential state as in that of FIG. 2. In the case of FIG. 7, it is different from the configuration of FIG. 2 that the local bit line LBLL or LBLR is not directly connected to the global bit line GBL when the read data is transmitted. Thus, in the local sense amplifier LSA, the read data can be amplified without being affected by the potential of the global bit line GBL and parasitic capacitances. Therefore, the operation of the local sense amplifier LSA can be stabilized so that operating margin increases, and it is possible to obtain an effect that the read data can be transmitted to the global bit line GBL at an earlier timing than in the configuration of FIG. 2.

Meanwhile, in a write operation in FIG. 7, when a memory cell MC in the left area is selected by either one of the word lines WLL0 to WLL127, the write control signal WEL is set to High, and write data is written into the memory cell MC from the global bit line GBL through the transistor Q44 and the local bit line LBLL that are located in the left area. Similarly, when a memory cell MC in the right area is selected by either one of the word lines WLR0 to WLR127, the write control signal WER is set to High, and write data is written into the memory cell MC from the global bit line GBL through the transistor Q45 and the local bit line LBLR that are located in the right area. In this manner, the write data is transmitted through the selected local bit line LBL (S) and is directly written into the memory cell MC without being transmitted through the local sense amplifier LSA in the write operation. This operation is performed in the same manner as in the configuration of FIG. 2, and the path for inverting and driving the write data by the local sense amplifier LSA is eliminated, thereby obtaining an effect of shortening writing time.

Next, a read operation in DRAM in the configuration of FIG. 7 will be described with reference to FIGS. 8 and 9. FIG. 8 shows waveforms when reading low-level data from the memory cell MC, and FIG. 9 shows operation waveforms when reading high-level data from the memory cell MC. Most of the waveforms in FIGS. 8 and 9 are common to those in FIGS. 5 and 6, and thus different points will be mainly described below. In FIGS. 8 and 9, the five periods (T1 to T5) and the voltage levels along the vertical axis have the same meanings as in FIGS. 5 and 6.

Figure 8:
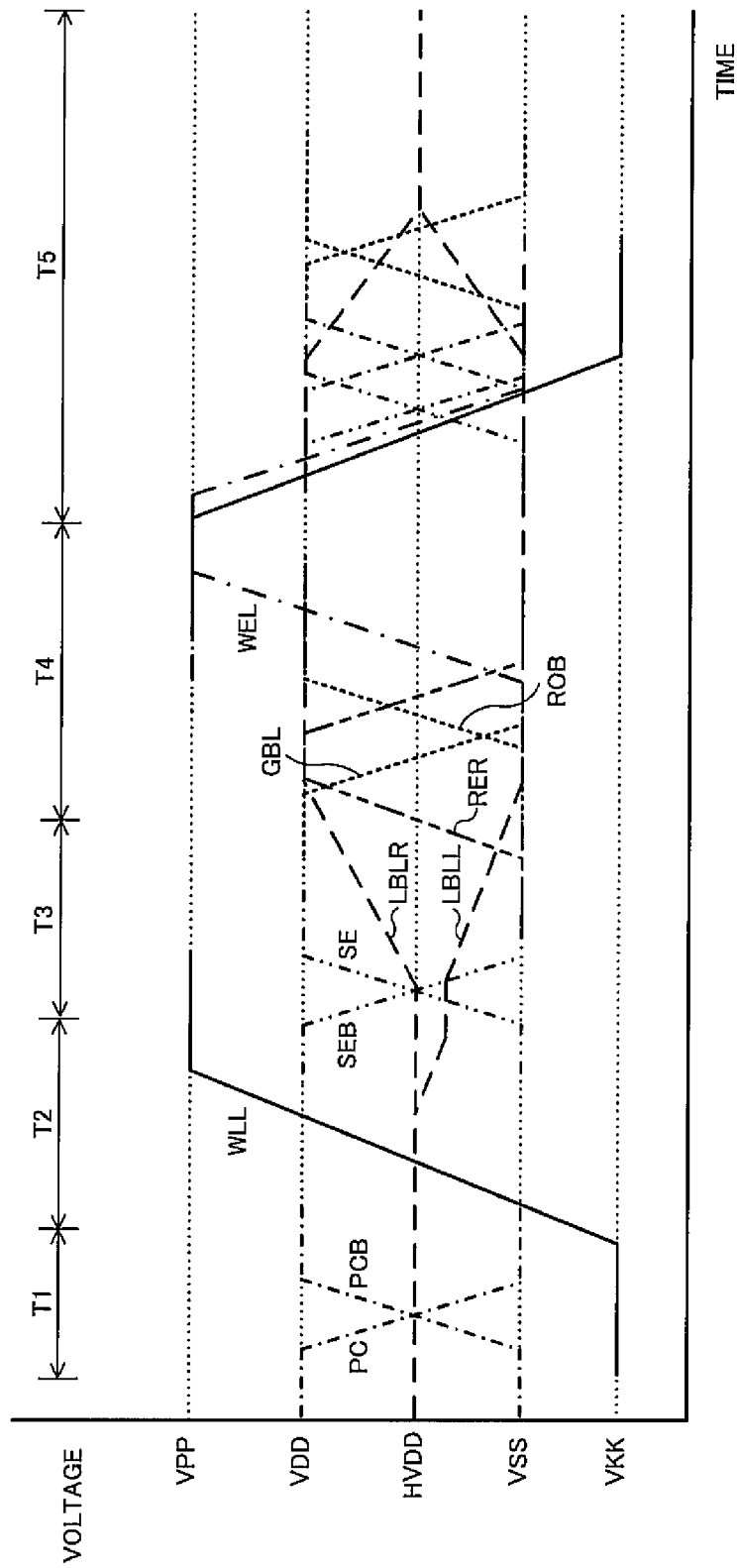
FIG. 8 is a diagram showing operation waveforms when reading low-level data from the memory cell MC regarding a read operation in DRAM of FIG. 7.

As shown in FIG. 8, in the read operation of the low-level data, operations are performed in the same manner as in FIG. 5 until halfway through the first amplification period T3. However, the read control signal RER is set to High immediately before moving into the second amplification period T4. Then, when moving into the second amplification period T4, the potential of the global bit line GBL drops to the ground potential VSS through the transistors Q43 and Q42. As a result, the latch LT in the global sense amplifier GSA is inverted, and its output signal ROB rises to the power supply voltage VDD. Thereafter, the read control signal RER is returned to Low, and the write control signal WEL is set to the voltage VPP in order to perform a subsequent write operation (not shown). Then, when moving into the precharge period T5, the write control signal WEL is returned to Low so that the local bit line LBLL is disconnected from the global bit line GBL.

Figure 9:
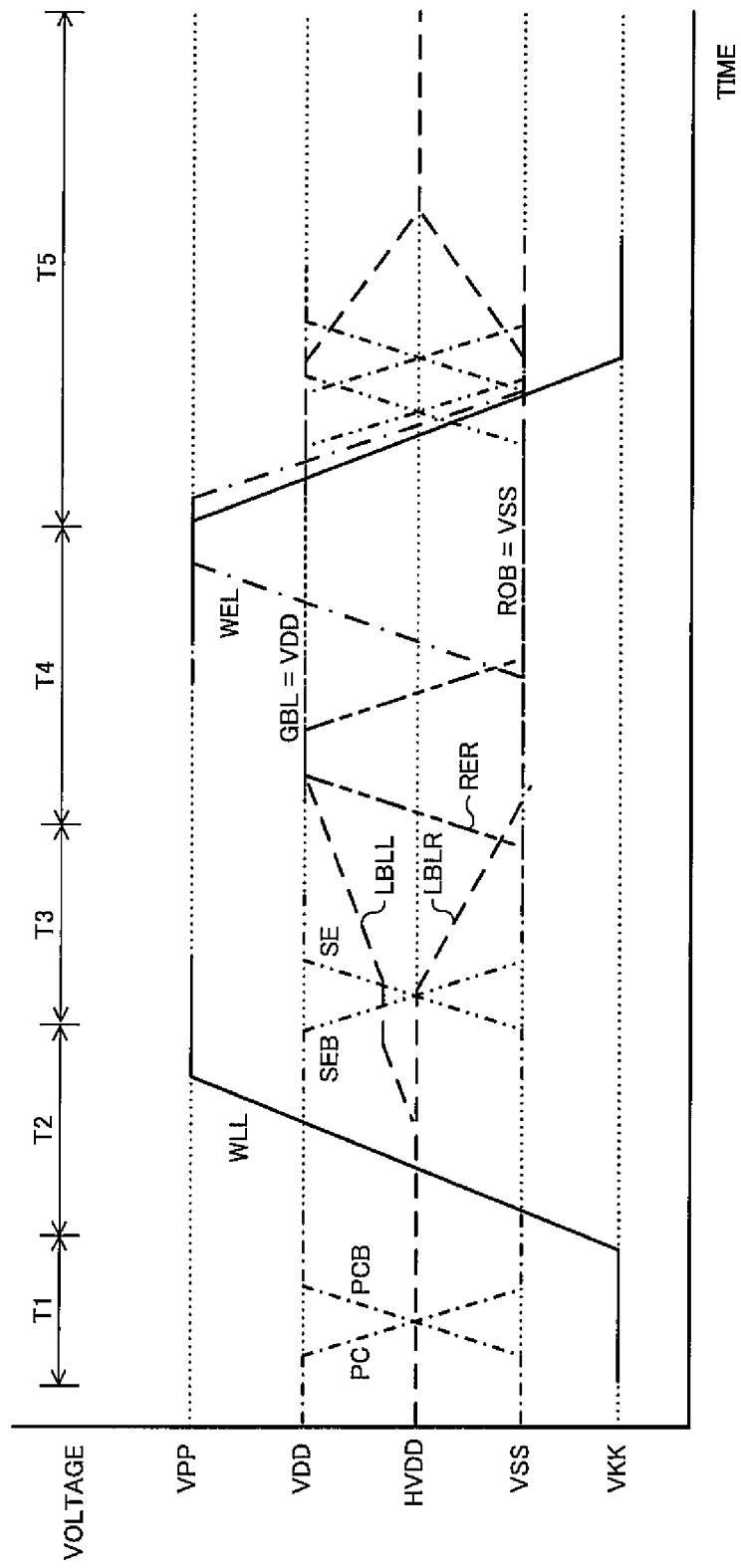
FIG. 9 is a diagram showing operation waveforms when reading high-level data from the memory cell MC regarding the read operation in DRAM of FIG. 7.

Next, as shown in FIG. 9, in the read operation of the high-level data, after operations are performed in the same manner as in FIG. 6 until halfway through the first amplification period T3, the read control signal RER is set to High immediately before moving into the second amplification period T4 similarly as in FIG. 8. Then, when moving into the second amplification period T4, the transistor Q43 is maintained in an OFF state since the potential of the local bit line LBLR is low, as different from FIG. 8. Thus, the global bit line GBL is maintained at the power supply voltage VDD, and the output signal ROB obtained by inverting the potential of the global bit line GBL by the latch LT continues to be maintained at the ground potential VSS. Subsequent operations are the same as those of FIG. 6, so description thereof will be omitted.

Figure 10:
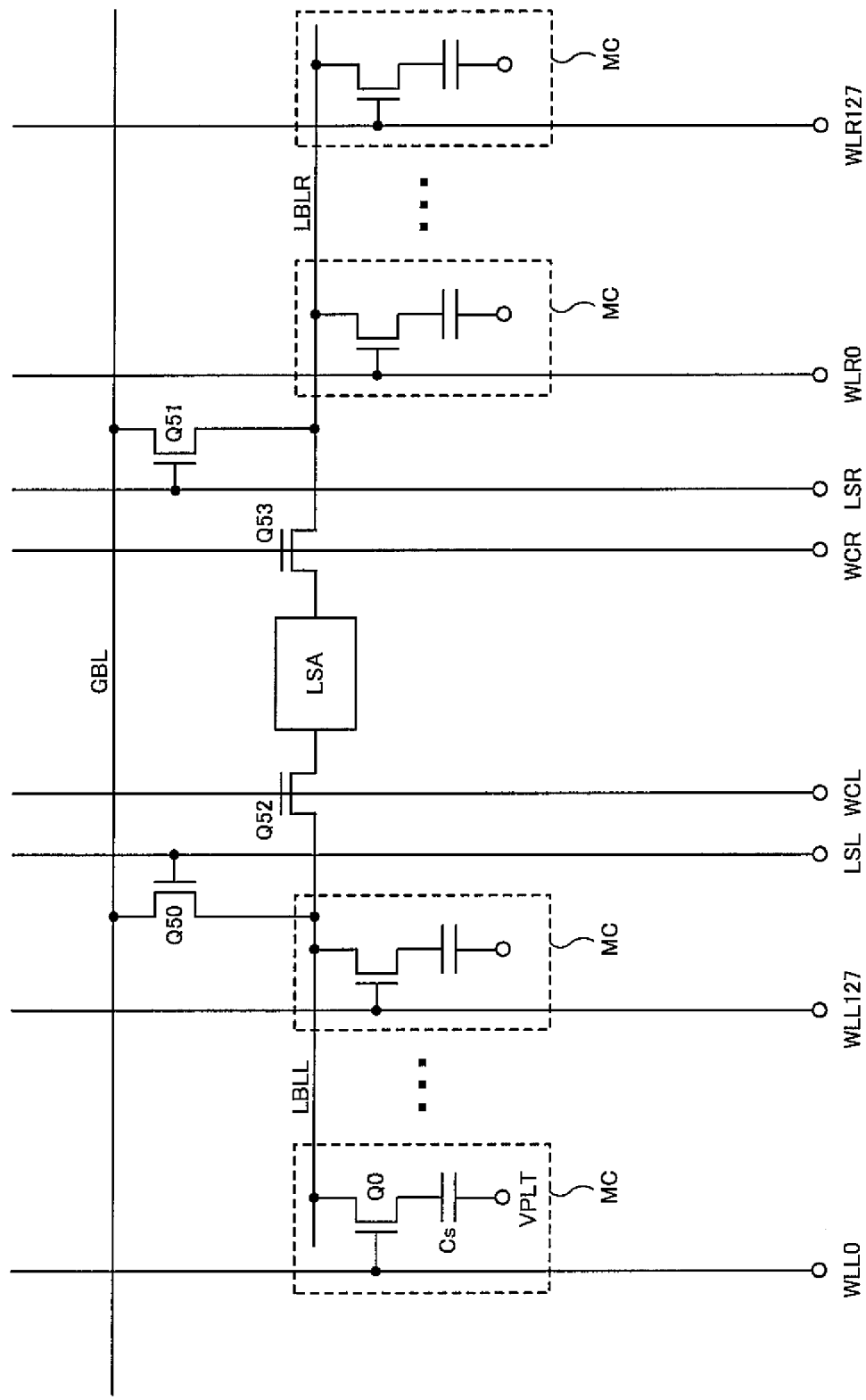
FIG. 10 is a diagram showing a circuit configuration of a main part of the memory cell array 10 of an embodiment.

Next, a semiconductor device of an embodiment will be described with reference to FIGS. 10 to 12. The entire configuration of FIG. 1 is common in DRAM as the semiconductor device of this embodiment. FIG. 10 shows a circuit configuration of a main part of the memory cell array 10 of this embodiment. In the circuit configuration shown in FIG. 10, the global bit line GBL, the local sense amplifier LSA, the local bit lines LBLL and LBLR, the plurality of word lines WL and the plurality of memory cells MC are the same as those in the circuit configuration of FIG. 2. Also, respective circuit configurations of the local sense amplifier LSA and the global sense amplifier GSA in FIG. 10 are the same as those in FIGS. 3 and 4. In the following, in relation to the circuit configuration of FIG. 10, points different from the circuit configuration of FIG. 2 will be mainly described.

The circuit configuration of FIG. 10 includes four NMOS type transistor Q50, Q51, Q52 and Q53. Among these, the transistors Q50 and 51 are a pair of transistor switches that operate in the same manner as the transistors Q10 and Q11 of FIG. 2. Meanwhile, the transistor Q52 controls an electrical connection between the local bit line LBLL and the local sense amplifier LSA in response to an assist signal WCL applied to its gate. Further, the transistor Q53 controls an electrical connection between the local bit line LBLR and the local sense amplifier LSA in response to an assist signal WCR applied to its gate.

In a read operation in FIG. 10, the above transistors Q52 and Q53 are both maintained in an ON state until read data of the memory cell MC is amplified by the local sense amplifier LSA and transmitted to the global bit line GBL. In a subsequent write operation, the transistor Q52 or Q53 corresponding to the selected local bit line LBL(S) is switched off so that the global bit line GBL and the selected local bit line LBL(S) are disconnected from each other. Thereby, it is not necessary to invert the dynamic latch in the local sense amplifier LSA in tandem with inverting write data by the local sense amplifier LSA, and therefore it is possible to obtain an effect of further speeding up the write operation in comparison with the configurations of FIGS. 2 and 7.

Next, a read operation of the configuration of FIG. 10 will be described with reference to FIGS. 11 and 12. FIG. 11 shows operation waveforms when reading low-level data from the memory cell MC, and FIG. 12 shows operation waveforms when reading high-level data from the memory cell MC. Most of the waveforms in FIGS. 11 and 12 are common to those in FIGS. 5 and 6, and thus different points will be mainly described below. In FIGS. 11 and 12, the five periods (T1 to T5) and the voltage levels along the vertical axis have the same meanings as in FIGS. 5 and 6.

Figure 11:
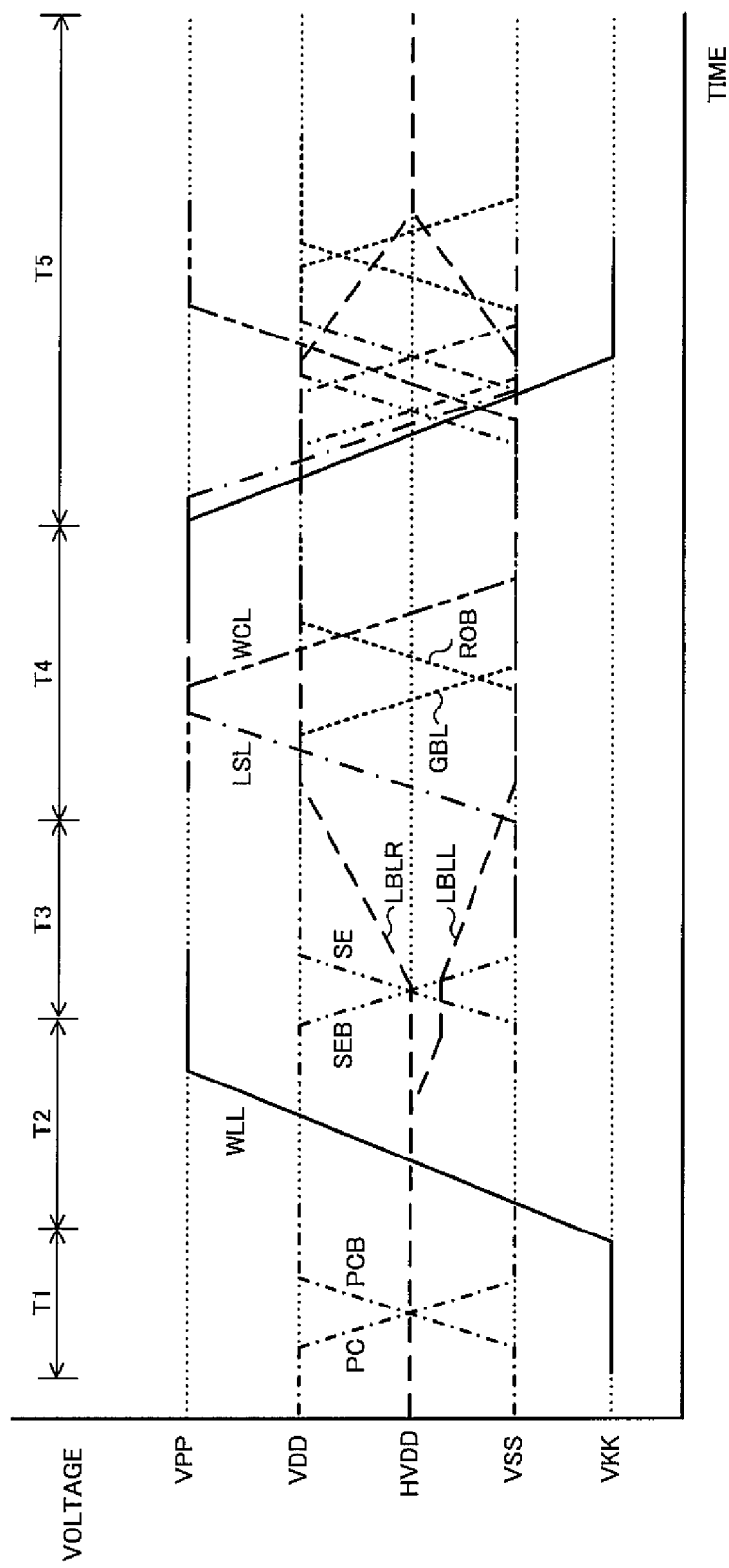
FIG. 11 is a diagram showing operation waveforms when reading low-level data from the memory cell MC regarding a read operation in DRAM of FIG. 10.

As shown in FIG. 11, in the read operation of the low-level data, operations are performed in the same manner as in FIG. 5 until halfway through the second amplification period T4. However, the assist signal WCL is set to Low after the potential of the global bit line GBL drops to the ground potential VSS. Thereby, the transistor Q52 turns off, and the local bit line LBLL is disconnected from the local sense amplifier LSA so that a subsequent write operation is allowed to be performed. Thereafter, when moving into the precharge period T5, the assist signal WCL is returned to the voltage VPP, and the local bit line LBLL is connected to the local sense amplifier LSA again.

Figure 12:
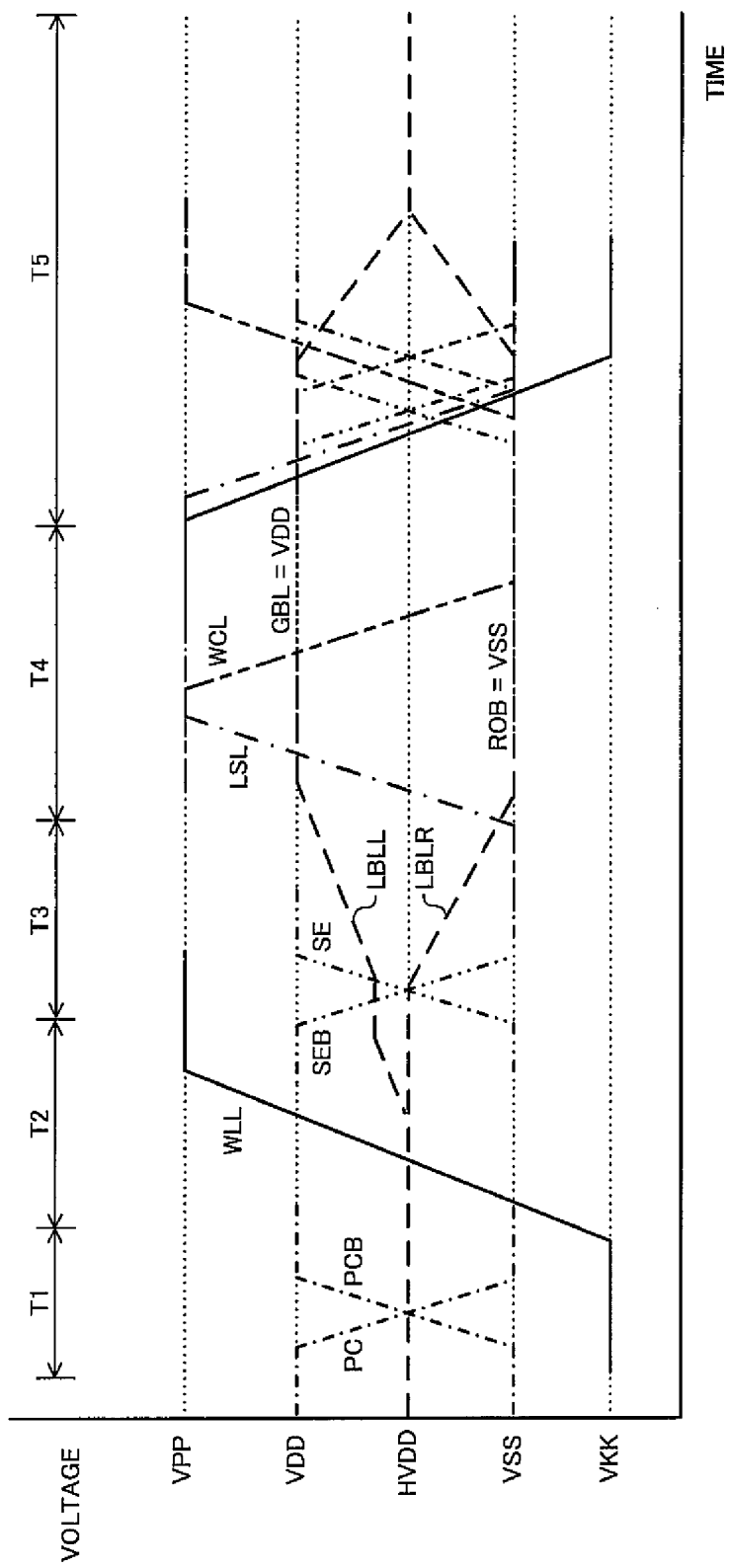
FIG. 12 is a diagram showing operation waveforms when reading high-level data from the memory cell MC regarding the read operation in DRAM of FIG. 10.

Next, as shown in FIG. 12, in the read operation of the high-level data, after operations are performed in the same manner as in FIG. 6 until halfway through the second amplification period T4, the assist signal WCL is set to Low similarly as in FIG. 11. Thereby, the transistor Q52 turns off, and the local bit line LBLL is disconnected from the local sense amplifier LSA. At this point, since the transistor Q50 is in an ON state and potentials of the global bit line GBL and the local bit line LBLL are the same as each ether (power supply voltage VDD), the output signal ROB of the latch LT continues to be maintained at the ground potential VSS by the same operation as in FIG. 6. Subsequent operations are the same as those of FIG. 11, so description thereof will be omitted.

In addition, the configurations of FIGS. 7 and 10 can be combined with each other, which is not shown in FIGS. 7 and 10. A circuit configuration of this case includes the transistors Q40 to Q45 of FIG. 7 and the transistors Q52 and Q53 of FIG. 10, and has both effects of the configurations of FIGS. 7 and 10.

Figure 13:
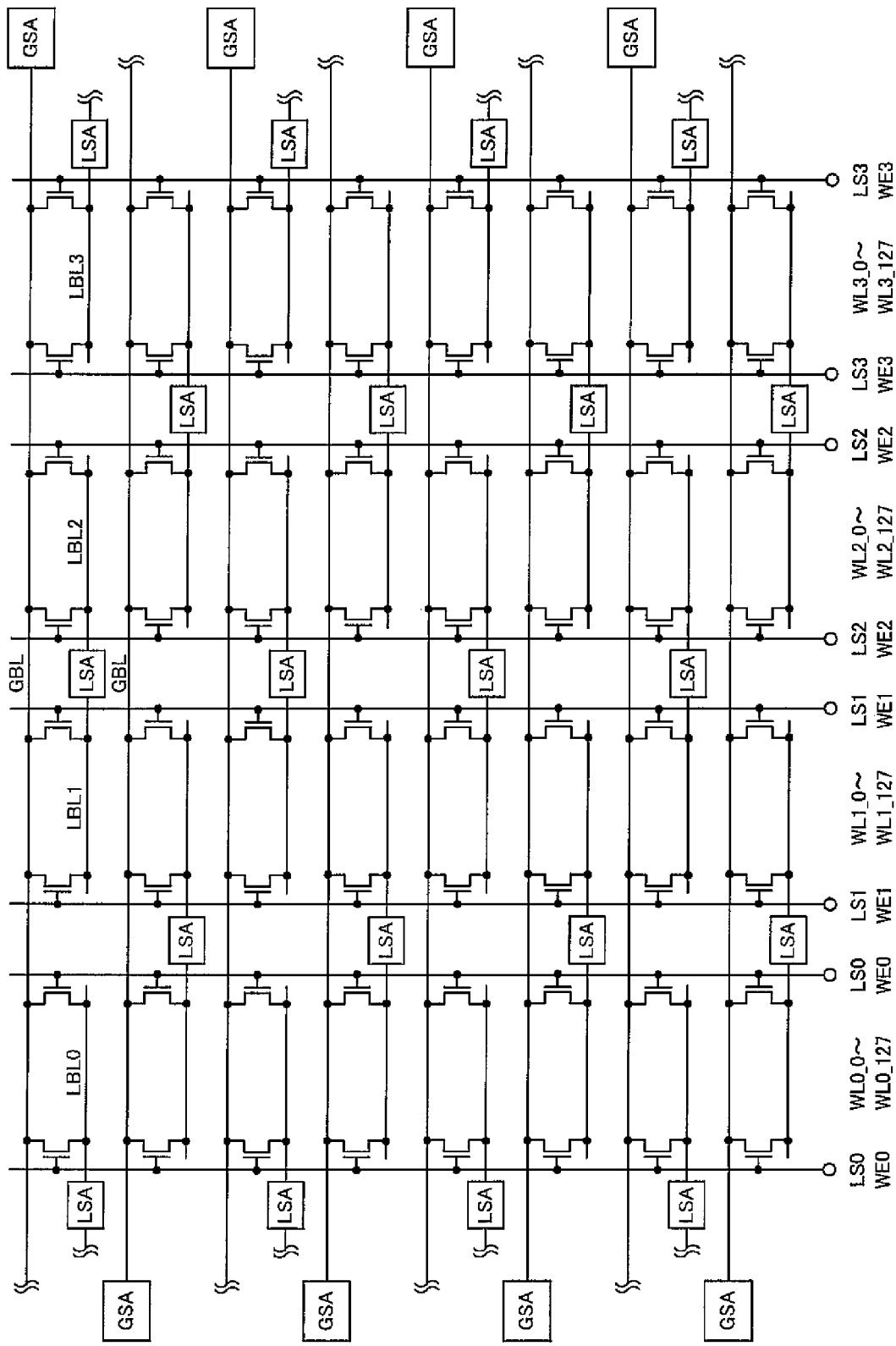
FIG. 13 is a diagram showing a first configuration example that can be applied to the respective configurations of FIGS. 2, 7 and 10.

Next, a specific configuration example for configuring the entire memory cell array 10 using the circuit configurations shown in FIGS. 2, 7 and 10 will be described. FIG. 13 shows a first configuration example that can be applied to the respective configurations of FIGS. 2, 7 and 10. The memory cell array 10 shown in FIG. 13 is obtained by arranging a plurality of unit circuits along an extending direction of the global bit lines GBL, in which each of the unit circuits is a range including one local sense amplifier LSA and a pair of local bit lines LBL on both sides. Practically, the local bit lines LBLL and LBLR are alternately arranged along the extending direction of each global bit line GBL. However, in the example of FIG. 13, the local bit lines LBL are represented with numbers, such as local bit lines LBL 0, LBL1 and LBL2 from the left, and corresponding signal lines are also represented with the same numbers.

In FIG. 13, with respect to a plurality of global bit lines GBL arranged in the word line extending direction, global sense amplifiers GSA on the left side and global sense amplifier GSA on the right side are alternately arranged. Similarly, a plurality of local sense amplifiers LSA corresponding to the plurality of global sense amplifiers GSA are arranged in a zigzag alignment. Thereby, a line pitch of the local sense amplifiers LSA and the global sense amplifiers GSA in the word line extending direction can be doubled. That is, by arranging the global sense amplifiers GSA and the local sense amplifiers LSA in the manner shown in FIG. 13, the line pitch thereof can be twice a line pitch of the global bit lines GBL and the local bit lines LBL. Therefore, it is possible to obtain an effect of easily laying out the global sense amplifiers GSA and the local sense amplifiers LSA.

Further, FIG. 13 shows four transistors connected between the two local bit lines LBL in one unit circuit and the global bit line GBL, which are corresponding to the transistors Q10 and Q11 of FIG. 2, the transistors Q44 and Q45 of FIG. 7, and the transistors Q50 and 51 of FIG. 10. That is, a pair of switches (two transistors) is disposed at a near side of the local sense amplifier LSA in FIGS. 2, 7 and 10, and in contrast, it is characteristic that two pairs of switches (four transistors) are disposed at near and far sides of the local sense amplifier LSA in FIG. 13. Thereby, in the write operation, the write control signal can be supplied to each of the transistors alternately disposed at the near and far sides through a certain line extending in the word line extending direction. Thus, it is possible to further speed up the write operation without increasing the number of lines for the control signals.

Figure 14:
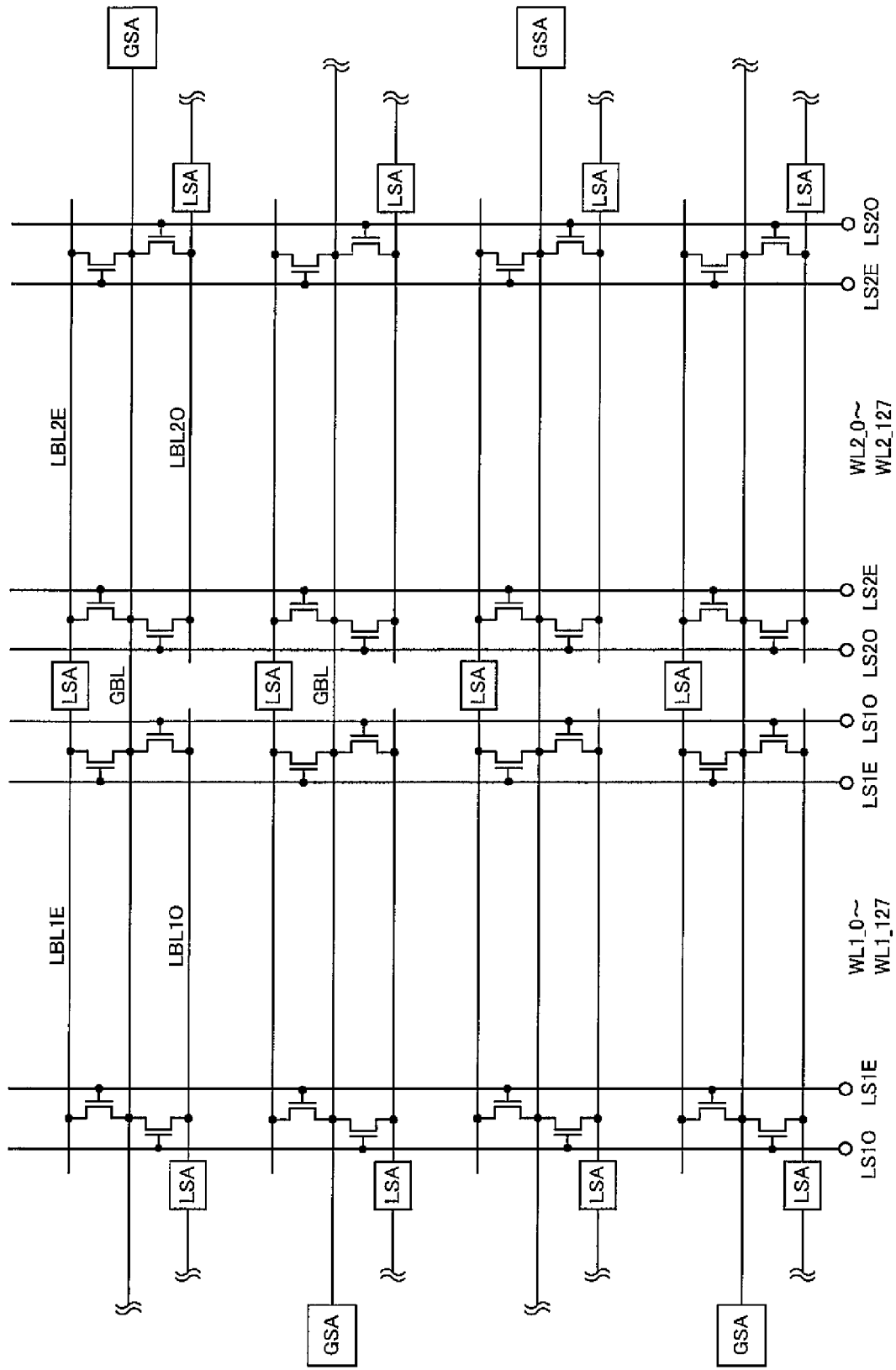
FIG. 14 is a diagram showing a second configuration example that can be applied to the configuration of FIG. 2.

FIG. 14 shows a second configuration example that can be applied to the configuration of FIG. 2. The memory cell array 10 shown in FIG. 14 is obtained by arranging the above unit circuits on both sides in the word line extending direction with respect to one global bit line GBL. That is, in the example of FIG. 14, a unit circuit including an even-numbered pair of local bit lines LBL1E and LBL2E and a local sense amplifier LSA and a unit circuit including an odd-numbered pair of local bit lines LBL1O and LBL2O and a local sense amplifier LSA face each other across the global bit line GBL. Different write control signals are supplied to switches of the both unit circuits.

In FIG. 14, for example, when one of the word lines WL 1_0 to WL 1_127 in the left area is selected, the global bit line GBL and the even-numbered local bit line LBL can be connected to each other by setting one control signal LS1E to High, and the global bit line GBL and the odd-numbered local bit line LBL can be connected to each other by setting the other control signal LS1O to High. In this manner, the same operation can be achieved even when employing a configuration in which one global bit line GBL is arranged for two local bit lines LBL in the word line extending direction. In addition, a ratio of the number of the local bit lines LBL and the number of the global bit lines GBL is two to one in the example of FIG. 14. However, the ration is not limited to this, and can be extended to N to one (N is an integer greater than or equal to 2).

By employing the second configuration example, it is possible to widen the line pitch of the global bit lines GBL that are largely restricted in manufacturing, thereby obtaining an effect of simplifying the manufacturing process. Further, a power supply wirings serving as a shield may be arranged between adjacent global bit lines GBL. Thereby it is possible to reduce coupling noise between the adjacent global bit lines GBL, and it is possible to improve sensing margin by enhancing the power supply supplied to the local sense amplifiers LSA and the global sense amplifiers GSA.

Figure 15:
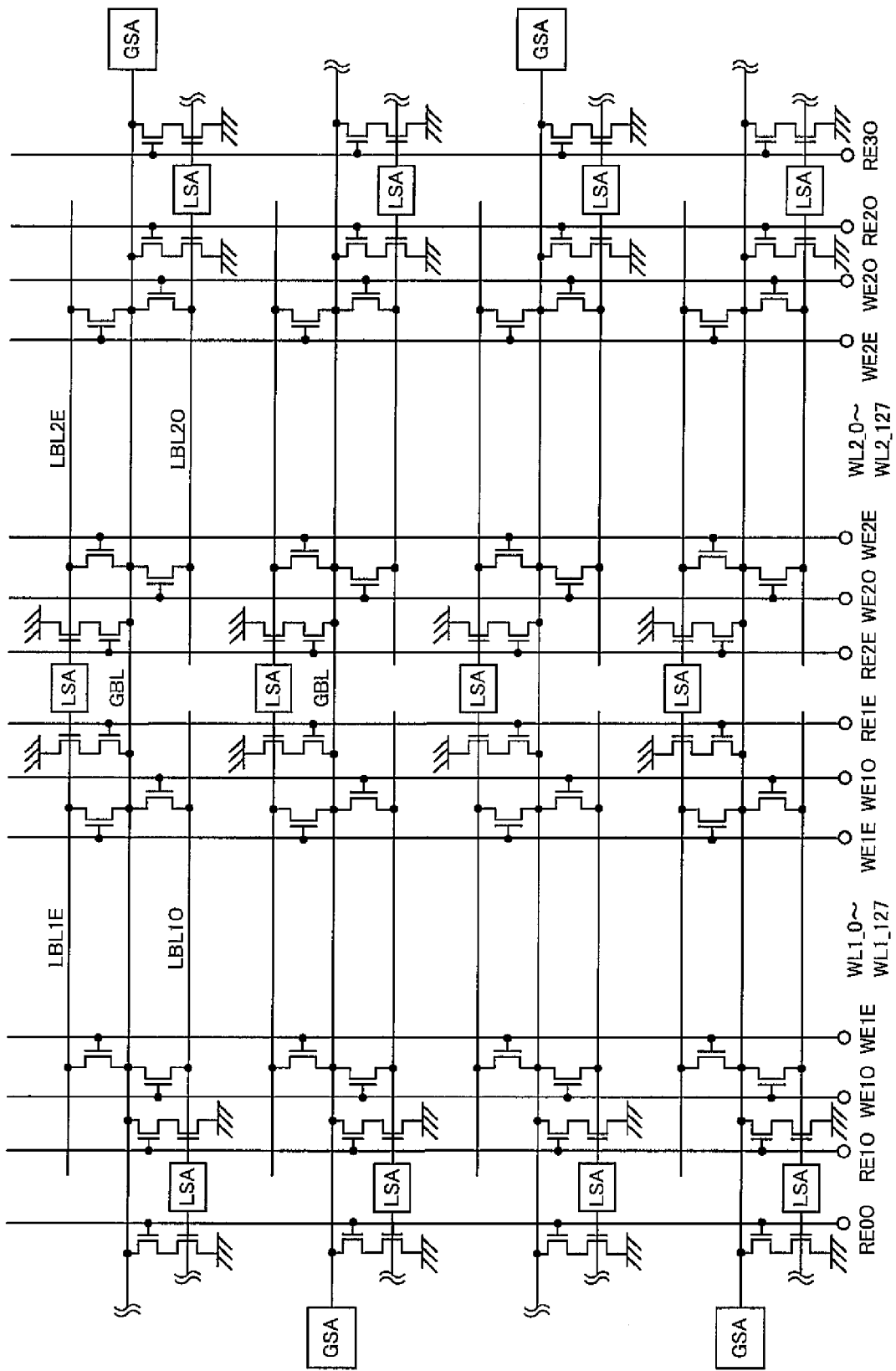
FIG. 15 is a diagram showing a third configuration example that can be applied to the configuration of FIG. 7.

FIG. 15 shows a third configuration example that can be applied to the configuration of FIG. 7. The memory cell array 10 shown in FIG. 15 has the same feature as that of FIG. 14, in which the above unit circuits are arranged on both sides in the word line extending direction with respect to one global bit line GBL. For example, when one of the word lines WL 1_0 to WL 1_127 in the left area is selected, the even-numbered local bit line LBL can be used to perform the same operation described in FIG. 7 by setting one write control signal WE1E to High after setting one read control signal RE2E to High for a certain period of time, and the odd-numbered local bit line LBL can be used to perform the same operation described in FIG. 7 by setting the other write control signal WE1O to High after setting the other read control signal RE0O to High for a certain period of time. Thus, the third configuration example can obtain the same effect as the second configuration example. In addition, the ratio of the number of the local bit lines LBL and the number of the global bit lines GBL can be extended to N to one in the same manner as in the second configuration example.

Figure 16:
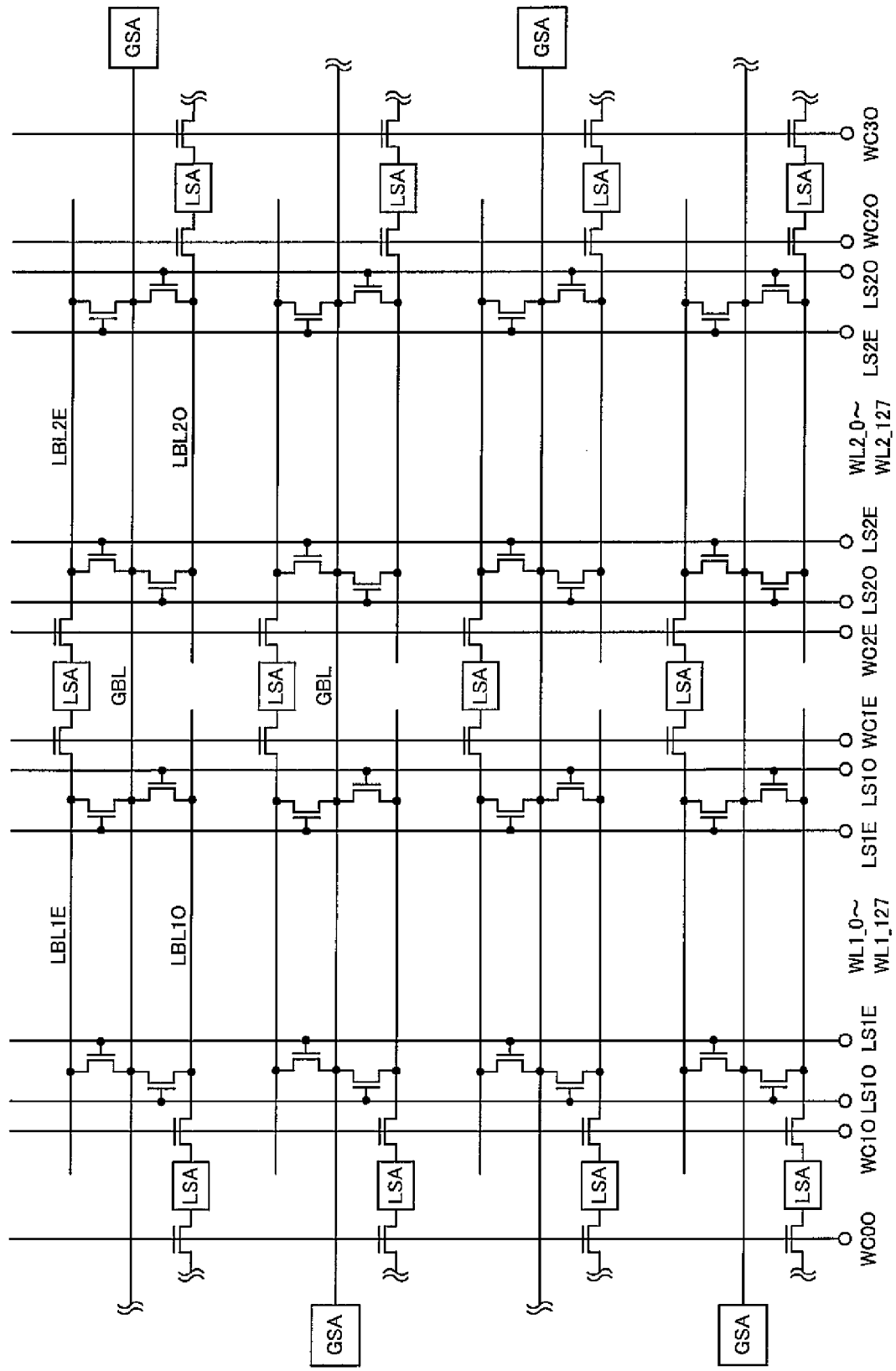
FIG. 16 is a diagram showing a fourth configuration example that can be applied to the configuration of FIG. 10.

FIG. 16 shows a fourth configuration example that can be applied to the configuration of FIG. 10. The memory cell array 10 shown in FIG. 16 has the same feature as that of FIGS. 14 and 15, in which the above unit circuits are arranged on both sides in the word line extending direction with respect to one global bit line GBL. For example, when one of the word lines WL 1_0 to WL 1_127 in the left area is selected, the even-numbered local bit line LBL can be used to perform the same operation described in FIG. 10 by setting one assist signal WC1E to Low after setting one control signal LS1E to High, and the odd-numbered local bit line LBL can be used to perform the same operation described in FIG. 7 by setting the other assist signal WC1O to Low after setting the other read control signal LS1O to High. Thus, the fourth configuration example can obtain the same effect as the second and third configuration examples. In addition, the ratio of the number of the local bit lines LBL and the number of the global bit lines GBL can be extended to N to one in the same manner as in the second and third configuration examples.

As described above, the embodiments of the invention have been described. However the invention is not limited to the above embodiments and can variously be modified without departing the essentials of the invention. For example, the plurality of memory cells MC included in the memory cell array 10 may include either volatile or non-volatile memory cells, and may include both volatile and non-volatile memory cells. Further, the invention can be applied to various semiconductor devices that include circuits for transmitting signals. The circuits configured in the semiconductor devices to which the invention is applied are not limited to the configurations disclosed in the above embodiments, and various circuit configurations can be employed.

Further, the invention can be applied to various semiconductor devices without being limited to the DRAM disclosed in the above embodiments. For example, semiconductor devices such as CPU (Central Processing Unit), MCU (Micro Control Unit), DSP (Digital Signal Processor), ASIC (Application Specific Integrated Circuit) and ASSP (Application Specific Standard Product) can be employed. Further, the invention can be applied to various device structures such as SOC (System on Chip), MCP (Multi Chip Package) and POP (Package on Package).

Field-effect transistors (FETs) can be used as transistors included in the semiconductor device of the invention, and various FETs such as not only MOS (Metal Oxide Semiconductor) transistors but also MIS (Metal-Insulator Semiconductor) transistors may be used. Further, the semiconductor device may partially include bipolar transistors. Furthermore, an NMOS transistor (N-channel type transistors) is a typical example of a first conductive type transistor, and a PMOS transistor (P-channel type transistor) is a typical example of a second conductive type transistor.

The present invention can be applied to devices based on various combinations or selections of the disclosure of the embodiments. That is, the present invention covers various modifications which those skilled in the art can carry out in accordance with all disclosures including claims and technical ideas.

The invention claimed is:

1. A semiconductor device comprising:
  a first local bit line coupled to a plurality of memory cells arranged in a first area;
  a second local bit line coupled to a plurality of memory cells arranged in a second area;
  a local sense amplifier of a differential type amplifying a voltage difference between the first and second local bit lines;
  a global bit line arranged in an extending direction of the first and second local bit lines;
  a first switch controlling an electrical connection between the first local bit line and the global bit line;
  a second switch controlling an electrical connection between the second local bit line and the global bit line; and a control circuit controlling the first and second switches, wherein in response to a selected memory cell of the memory cells, the control circuit renders one of the first and second switches conductive and renders the other thereof non-conductive.

2. The semiconductor device according to claim 1, further comprising a global sense amplifier of a single-ended type connected to one end of the global bit line.

3. The semiconductor device according to claim 1, wherein the control circuit renders the first switch conductive when the selected memory cell is in the first area, and renders the second switch conductive when the selected memory cell is in the second area.

4. The semiconductor device according to claim 3, further comprising:
a third switch controlling an electrical connection between the first local bit line and the local sense amplifier; and
a fourth switch controlling an electrical connection between the second local bit line and the local sense amplifier.

5. The semiconductor device according to claim 4, wherein the control circuit renders the third switch non-conductive when a data is written into the selected memory cell that is in the first area, and renders the fourth switch non-conductive when a data is written into the selected memory cell that is in the second area.

6. The semiconductor device according to claim 3, further comprising:
a first transistor having a gate connected to the second local bit line;
a fifth switch controlling an electrical connection between an output node of the first transistor and the global bit line;
a second transistor having a gate connected to the first local bit line; and
a sixth switch controlling an electrical connection between an output node of the second transistor and the global bit line.

7. The semiconductor device according to claim 6, wherein the control circuit renders the fifth switch conductive and the sixth switch non-conductive, respectively, when a data read operation is performed on the selected memory cell that is in the first area, and renders the sixth switch conductive and the fifth switch non-conductive, respectively, when the data read operation is performed on the selected memory cell that is in the second area.

8. The semiconductor device according to claim 6, wherein the control circuit renders the first switch conductive when a data is written into the selected memory cell that is in the first area, renders the second switch conductive when a data is written into the selected memory cell that is in the second area, and renders both the fifth and sixth switches non-conductive when a data is written into the selected memory cell.

9. The semiconductor device according to claim 1, wherein the first switch comprises at least two switches respectively disposed at near and far sides of the local sense amplifier,
and the second switch comprises at least two switches respectively disposed at near and far sides of the local sense amplifier.

10. A semiconductor device comprising:
a first local bit line extending in a first direction;
a second local bit line extending in the first direction;
a plurality of first word lines each intersecting the first local bit line;
a plurality of second word lines each intersecting the second local bit line;
a plurality of first memory cells each coupled to the first bit line and an associate one of the first word lines;
a plurality of second memory cells each coupled to the second bit line and an associate one of the second word lines;
a sense amplifier arranged between the first and second local bit lines and including first and second nodes that are connected to the first and second local bit lines, respectively, the sense amplifier being configured to amplify a potential difference between the first and second nodes;
a global bit line extending in the first direction along the first and second local bit lines;
a first transistor circuit coupled to the first local bit line and the global bit line; and
a second transistor circuit coupled to the second local bit line and the global bit line,
wherein the first transistor circuit comprises a first transistor including a source-drain path connected between the first local bit line and the global bit line and a gate supplied with a first control signal, and the second transistor circuit comprises a second transistor including a source-drain path connected between the second local bit line and the global bit line and a gate supplied with a second control signal, and
wherein the first control signal takes an active level to turn the first transistor ON in response to one of the first memory cells being selected, and the second control signal takes an active level to turn the second transistor ON in response to one of the second memory cells being selected.

11. The device according to claim 10, wherein the first transistor circuit further comprises a third transistor including a source-drain path connected between the first local bit line and the first node of the sense amplifier and a gate supplied with a third control signal, and the second transistor circuit further comprises a fourth transistor including a source-drain path connected between the second local bit line and the second node of the sense amplifier and a gate supplied with a third control signal.

12. The device according to claim 11, wherein in response to one of the first memory cells being selected, each of the first and third control signals takes an active level to turn the first and third transistors ON and then the first control signal continues to take the active level with the third control signal being changed to an inactive level, and in response to one of the second memory cells being selected, each of the second and fourth control signals takes an active level to turn the second and fourth transistors ON and then the second control signal continues to take the active level with the fourth control signal being changed to an inactive level.

13. A semiconductor device comprising:
a global bit line extending in a first direction;
a global sense amplifier coupled to the global bit line to amplify a potential on the global bit line;
a first local bit line extending in the first direction in substantially parallel to the global bit line, the first local bit line including first and second end portions and a first intermediate portion therebetween;
a plurality of first memory cells each coupled to the first intermediate portion of the first local bit line;
a second local bit line extending in the first direction in substantially parallel to the global bit line, the second local bit line including third and fourth end portions and a second intermediate portion therebetween;
a plurality of second memory cells each coupled to the second intermediate portion of the second local bit line;

a first local sense amplifier between the first end portion of the first local bit line and the third end portion of the second local bit line, the first local sense amplifier being configured to amplify a potential difference between the first and second local bit lines;

a first transistor coupled between the first end portion of the first local bit line and the global bit line;

a second transistor coupled between the second end portion of the first local bit line and the global bit line;

a third transistor coupled between the third end portion of the second local bit line and the global bit line; and a fourth transistor coupled between the fourth end portion of the second local bit line and the global bit line.

14. The device according to claim 13, further comprising:

a third local bit line extending in the first direction in substantially parallel to the global bit line, the third local bit line including fifth and sixth end portions and a third intermediate portion therebetween;

a plurality of third memory cells each coupled to the third intermediate portion of the third local bit line;

a fourth local bit line extending in the first direction in substantially parallel to the global bit line, the fourth local bit line including seventh and eighth end portions and a fourth intermediate portion therebetween;

a plurality of fourth memory cells each coupled to the fourth intermediate portion of the fourth local bit line;

a second local sense amplifier between the fifth end portion of the third local bit line and the seventh end portion of the fourth local bit line, the second local sense amplifier being configured to amplify a potential difference between the third and fourth local bit lines;

a fifth transistor coupled between the fifth end portion of the third local bit line and the global bit line;

a sixth transistor coupled between the sixth end portion of the third local bit line and the global bit line;

a seventh transistor coupled between the seventh end portion of the fourth local bit line and the global bit line; and an eighth transistor coupled between the eighth end portion of the fourth local bit line and the global bit line.

15. The device according to claim 14, wherein the first and second local bit lines and the first local sense amplifier are disposed on one side of the global bit line, and the third and fourth local bit lines and the second local sense amplifier are disposed on the other side of the global bit line.

16. A semiconductor device comprising:

a first local bit line extending in a first direction;

a second local bit line extending in the first direction;

a plurality of first word lines each intersecting the first local bit line;

a plurality of second word lines each intersecting the second local bit line;

a plurality of first memory cells each coupled to the first bit line and an associate one of the first word lines;

a plurality of second memory cells each coupled to the second bit line and an associate one of the second word lines;

a sense amplifier arranged between the first and second local bit lines and including first and second nodes that are connected to the first and second local bit lines, respectively, the sense amplifier being configured to amplify a potential difference between the first and second nodes;

a global bit line extending in the first direction along the first and second local bit lines;

a first transistor circuit coupled to the first local bit line and the global bit line; and a second transistor circuit coupled to the second local bit line and the global bit line, wherein the first transistor circuit comprises:

a first transistor including a source-drain path connected between the first local bit line and the global bit line and a gate supplied with a first control signal;

a second transistor including a source-drain path and a gate supplied with a second control signal; and a third transistor including a source-drain path and a gate connected to the first local bit line, the source-drain paths of the second and third transistors being connected in series between the global bit line and a reference potential line, wherein the first transistor circuit comprises:

a fourth transistor including a source-drain path connected between the second local bit line and the global bit line and a gate supplied with a third control signal, a fifth transistor including a source-drain path and a gate supplied with a fourth control signal, and a sixth transistor including a source-drain path and a gate connected to the second local bit line, the source-drain paths of the fifth and sixth transistors being connected in series between the global bit line and the reference potential line.

17. The device according to claim 16, wherein in response to one of the second memory cells being selected, the second control signal takes an active level to turn the second transistor ON in a data read operation mode and the third control signal takes an active level to turn the fourth transistor ON in a data write operation mode, and in response to one of the first memory cells being selected, the fourth control signal takes an active level to turn the fifth transistor ON in a data read operation mode and the first control signal takes an active level to turn the first transistor ON in a data write operation mode.

* * * * *